United States Patent
Iwasa et al.

(10) Patent No.: US 10,957,838 B2
(45) Date of Patent: Mar. 23, 2021

(54) THERMOELECTRIC ELEMENT MATERIAL AND METHOD FOR MANUFACTURING THE SAME

(71) Applicant: RIKEN, Wako (JP)

(72) Inventors: Yoshihiro Iwasa, Wako (JP); Satria Zulkarnaen Bisri, Wako (JP); Sunao Shimizu, Wako (JP)

(73) Assignee: RIKEN, Saitama (JP)

( * ) Notice: Subject to any disclaimer, the term of this patent is extended or adjusted under 35 U.S.C. 154(b) by 71 days.

(21) Appl. No.: 16/244,166

(22) Filed: Jan. 10, 2019

(65) Prior Publication Data

US 2019/0148614 A1      May 16, 2019

Related U.S. Application Data

(63) Continuation-in-part of application No. PCT/JP2017/000041, filed on Jan. 4, 2017.

(30) Foreign Application Priority Data

Jul. 12, 2016    (JP) .............................. JP2016-137453

(51) Int. Cl.
| | |
|---|---|
| *H01L 35/14* | (2006.01) |
| *H01L 35/26* | (2006.01) |
| *H01L 35/34* | (2006.01) |
| *H01L 35/16* | (2006.01) |

(52) U.S. Cl.
CPC .............. *H01L 35/26* (2013.01); *H01L 35/16* (2013.01); *H01L 35/34* (2013.01)

(58) Field of Classification Search
CPC ......... H01L 35/16; H01L 35/14; H01L 35/26; H01L 35/34
See application file for complete search history.

(56) References Cited

FOREIGN PATENT DOCUMENTS

| | | |
|---|---|---|
| JP | 2015056491 A | 3/2015 |
| JP | 2015070204 A | 4/2015 |
| WO | 2008106732 A1 | 9/2008 |

OTHER PUBLICATIONS

Kim. Effects of Ionic Liquid Molecules in Hybrid PbS Quantum Dot-Organic Solar Cells. ACS Appl. Mater. Interfaces 2013, 5, 1757-1760 (Year: 2013).*
Brown, P. et al. Energy Level Modification in Lead Sulfide Quantum Dot Thin Films through Ligand Exchange, ACS Nano, Jun. 24, 2014, vol. 8, No. 6, pp. 5863-5872.
Bisri, S. et al. Low Driving Voltage and High Mobility Ambipolar Field-Effect Transistors with PbS Colloidal Nanocrystals, Advanced Materials, Aug. 21, 2013, vol. 25, No. 31, pp. 4309-4314.
(Continued)

*Primary Examiner* — Matthew E. Hoban
(74) *Attorney, Agent, or Firm* — Volpe Koenig

(57) ABSTRACT

A thermoelectric element material according to the present invention includes a quantum dot portion including a large number of quantum dots. The quantum dot portion includes carriers therein, the carriers serving to carry an electric current. Of the large number of quantum dots, adjacent quantum dots are separate from each other and are close to each other to an extent allowing the carriers to move between the quantum dots.

7 Claims, 10 Drawing Sheets

(56) References Cited

OTHER PUBLICATIONS

Bisri, S. et al. Thermoelectric Properties of Colloidal Quantum Dot Solids, ISBN 978-4-86348-555-6, Mar. 3, 2016, pp. 100000000-039.
Bisri, S. et al. Very High Seebeck Coefficient in Ultra-Thin-Film of Colloidal Quantum Dot Solids, The 9th International Conference on Quantum Dots [online], [Mar. 24, 2017], May 26, 2016, p. 281. <<http://www.qd2016.org/download/QD2016Proceedings_compressed.pdf.
International Search Report issued in corresponding International Patent Appln. No. PCT/JP2017/000041 dated Apr. 4, 2017, consisting of 14 pp.
Ibanez, M. et al. "High-performance thermoelectric nanocomposites from nanocrystal building blocks", Nature Communications, vol. 7, 10766, May 7, 2016.
Office Action issued in corresponding Japanese Patent Application No. 2016-137453 dated Apr. 22, 2020, consisting of 4 pp.
Brown, Patrick R., et al. Energy Level Modification in Lead Sulfide Quantum Dot Thin Films Through Ligand Exchange, ACS Nano, Jun. 24, 2014, vol. 8, No., pp. 5863-5872.
Bisri, Satria Zulkarnaen, et al. Low Driving Voltage and High Mobility Ambipolar Field-Effect Transistors with PbS Colloidal Nanocrys, Advanced Materials, Aug. 21, 2013, vol. 25, No. 31, pp. 4309-4314.
Bisri, Satria Zulkarnaen, et al. Thermoelectric Properties of Colloidal Quantum Dot Solids, Mar. 3, 2016, ISBN 978-4-86348-555-6, p. 100000000-039.
Bisri, Satria Zulkarnaen, et al. Very High Seebeck Coefficient in Ultra-Thin-Film of Colloidal Quantum Dot Solids, The 9th International Conference on Quantum Dots, Mar. 24, 2017, [online], May 26, 2016, p. 281, <<http://www.qd2016.org/download/QD2016Proceedings_compressed.pdf>>.

* cited by examiner

THERMOELECTRIC ELEMENT MATERIAL AND METHOD FOR MANUFACTURING THE SAME

CROSS REFERENCE TO RELATED APPLICATION

This application is a continuation-in-part of International Patent Application Serial No PCT/JP2017/000041, filed on Jan. 4, 2017, which claims priority from Japanese patent Application No 2016-137453 filed on Jul. 12, 2016 which are both incorporated by reference as if fully set forth.

TECHNICAL FIELD

The present invention relates to a thermoelectric element material including a quantum dot portion that includes a large number of quantum dots, and to a method for manufacturing the thermoelectric element material.

BACKGROUND ART

A thermoelectric element generates electric power when temperature difference exists between both ends thereof. One indicator that indicates the performance of the thermoelectric element is the power factor, $S^2\sigma$.

Here, S is a Seebeck coefficient (V/K) representing a ratio of a potential difference to temperature difference. Specifically, S is $\Delta V/\Delta T$ when a potential difference $\Delta V$ occurs between both ends of a thermoelectric element at a temperature difference $\Delta T$ therebetween.

Furthermore, $\sigma$ is the electrical conductivity (1/resistivity) (with unit S or siemens, which is $1/\Omega$) of the thermoelectric element.

A thermoelectric element material including quantum dots (nanocrystals) is described for example in Non-Patent Literature (NPL) 1 below. According to NPL 1, a semiconductor nanocrystal PbS and a metallic nanocrystal Ag are blended to produce a nanocomposite. This nanocomposite has a Seebeck coefficient S of up to about 400 ($\mu$V/K), and a power factor of up to about 2 ($\mu$W/cm·K$^2$) at room temperature and up to about 17 ($\mu$W/cm·K$^2$) at 850 K.

CITATION LIST

Non-Patent Literature

NPL 1: Maria Ibanez, Zhishan Luo, Aziz Genc, Laura Piveteau, Silvia Ortega, Doris Cadavid, Oleksandr Dobrozhan, Yu Liu, Maarten Nachtegaal, Mona Zebarjadi, Jordi Arbiol, Maksym V. Kovalenko, Andreu Cabot: "High-performance thermoelectric nanocomposites from nanocrystal building blocks", Nature Communications, vol. 7, 10766 (2016)

SUMMARY OF INVENTION

Technical Problem

A technique that enables a thermoelectric element material including quantum dots to achieve a higher power factor than before is desired.

Thus, an object of the present invention is to provide a thermoelectric element material including quantum dots and having a structure exhibiting a high power factor, and a method for manufacturing the thermoelectric element material.

Solution to Problem

A thermoelectric element material according to the present invention includes a quantum dot portion including a large number of quantum dots. The quantum dot portion includes carriers therein, the carriers serving to carry an electric current. Of the large number of quantum dots, adjacent quantum dots are separate from each other and are close to each other to an extent allowing the carriers to move between the quantum dots.

A manufacturing method according to the present invention is a method manufacturing a thermoelectric element material including a quantum dot portion including a large number of quantum dots, with carriers serving to carry an electric current being present in the quantum dot portion. This method includes a quantum-dot-portion producing process of causing adjacent quantum dots among the large number of quantum dots to be separate from each other and close to each other to an extent allowing the carriers to move between the quantum dots.

Advantageous Effects of Invention

FIG. 1A and FIG. 1B illustrate the principle of the present invention. FIG. 1A is a schematic graph indicating a relationship of a distance d between adjacent quantum dots in a quantum dot portion with a Seebeck coefficient S and an electrical conductivity $\sigma$ of the quantum dot portion. In FIG. 1A, the horizontal axis represents a distance d between adjacent quantum dots, and the vertical axis represents a Seebeck coefficient S and an electrical conductivity $\sigma$ of the quantum dot portion. FIG. 1B is a schematic graph indicating a relationship of a distance d between adjacent quantum dots with a power factor $S^2\sigma$ of the quantum dot portion.

As indicated in FIG. 1A, with d smaller than a range R, adjacent quantum dots fuse together and S becomes too small. On the other hand, with d greater than the range R, $\sigma$ becomes too small.

In the present invention, in the quantum dot portion, adjacent quantum dots are separate from each other. This means that in FIG. 1A, d is not smaller than a lower limit $d_{min}$ of the range R. Accordingly, the Seebeck coefficient S of the quantum dot portion takes a value sufficiently large as a thermoelectric element material.

Further, in the present invention, the adjacent quantum dots are close to each other to such an extent that the carriers can move between the quantum dots. Accordingly, the electrical conductivity $\sigma$ of the quantum dot portion takes a value sufficiently large as a thermoelectric element material. For example, in FIG. 1A, d is not greater than an upper limit $d_{max}$ of the range R.

As described above, according to the present invention, the quantum dot portion in the thermoelectric element material achieves the Seebeck coefficient S and the electrical conductivity $\sigma$ both sufficiently large as those of a thermoelectric element material, whereby a large power factor $S^2\sigma$ is obtained.

DESCRIPTION OF EMBODIMENTS

Embodiments of the present invention are described below with reference to the drawings. Throughout the drawings, common parts are denoted by the same reference symbols, and overlapping description thereof is omitted.

First Embodiment (Configuration of Thermoelectric Element Material)

Figure 2A:
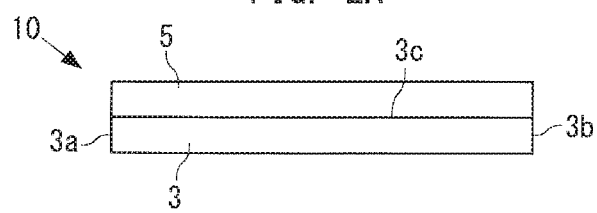
FIG. 2A illustrates a configuration of a thermoelectric element material according to a first embodiment of the present invention.

FIG. 2A illustrates a configuration of a thermoelectric element material 10 according to a first embodiment of the present invention. The reference symbol 10 denotes the entire configuration in FIG. 2A. The thermoelectric element material 10 is used for a thermoelectric element. For example, with a temperature difference between both ends 3a and 3b of the thermoelectric element material 10, a potential difference occurs between the ends 3a and 3b. This potential difference is output externally to the desired position. The thermoelectric element material 10 includes a quantum dot portion 3 and an ionic medium 5.

Figure 2B:
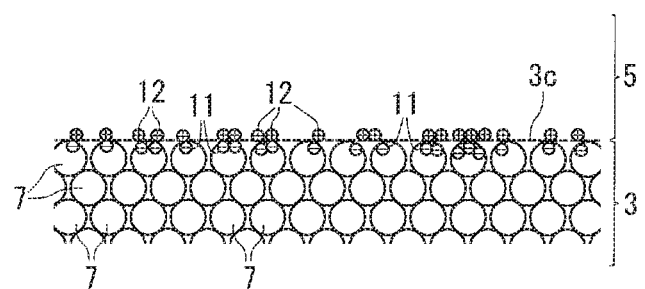
FIG. 2B is a partially enlarged view of FIG. 2A.
Figure 2C:
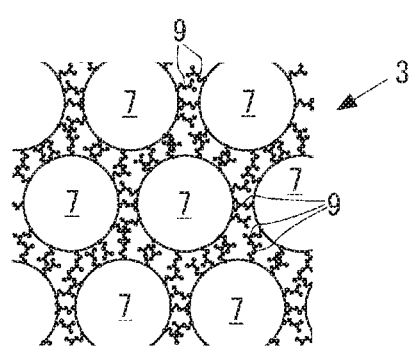
FIG. 2C is a partially enlarged view of FIG. 2B.

FIG. 2B is a partially enlarged view of FIG. 2A, illustrating an interface between the quantum dot portion 3 and the ionic medium 5 and its vicinity. The broken line in FIG. 2B indicates the interface between the quantum dot portion 3 and the ionic medium 5. FIG. 2C is a partially enlarged view of FIG. 2B, illustrating a plurality of quantum dots 7.

The quantum dot portion 3 is constituted by a large number of quantum dots 7. The quantum dot portion 3 is solid matter. The quantum dot portion 3 includes carriers 11 therein, which serves to carry an electric current. In the quantum dot portion 3, adjacent quantum dots 7 are separated from each other and are close to each other to an extent allowing the carriers 11 to move between the quantum dots 7.

The matter that the adjacent quantum dots 7 are separate from each other means that the adjacent quantum dots 7 are in an unfused state. The unfused state means that the respective quantum dots 7 independently maintain characteristics as a quantum dot. One of such characteristics as a quantum dot is that its electron energy levels are discrete.

Each quantum dot 7 may have a size of not smaller than several nanometers and not larger than several tens of nanometers (e.g., not smaller than 2 nm and not larger than 20 nm). The size of a quantum dot 7 means a maximum value among the sizes, in respective directions, of the quantum dot 7.

A preferable degree of proximity between the quantum dots 7 is for example as follows. A distance between the centers of adjacent quantum dots 7 is not greater than 1.5 times (more preferably, not greater than 1.2 times, still more preferably, not greater than 1.1 times) the size of the quantum dot 7. According to the present invention, however, a degree of proximity between the quantum dots 7 is not limited to the above example and may be any degree that allows the carriers 11 to move between the adjacent quantum dots 7 (in the present specification, "move between the adjacent quantum dots 7" means "move from one of the adjacent quantum dots 7 and arrive at another of the adjacent quantum dots 7").

In the quantum dot portion 3, adjacent quantum dots 7 are coupled to each other via ligands 9, as illustrated in FIG. 2C. In other words, both ends of the ligand 9 are bonded respectively to the adjacent quantum dots 7. With this configuration, the adjacent quantum dots 7 are separate from each other. The ligand 9 is short in length to an extent allowing the carriers 11 to move between the adjacent quantum dots 7.

Figure 1A:
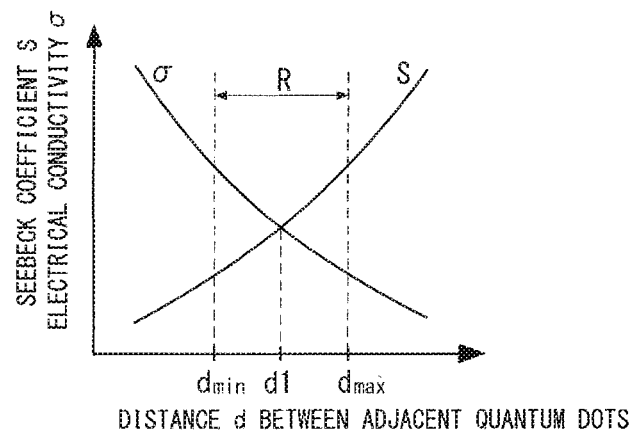
FIG. 1A is a schematic graph indicating a Seebeck coefficient S and an electrical conductivity $\sigma$ of a quantum dot portion with respect to a distance d between quantum dots.
Figure 1B:
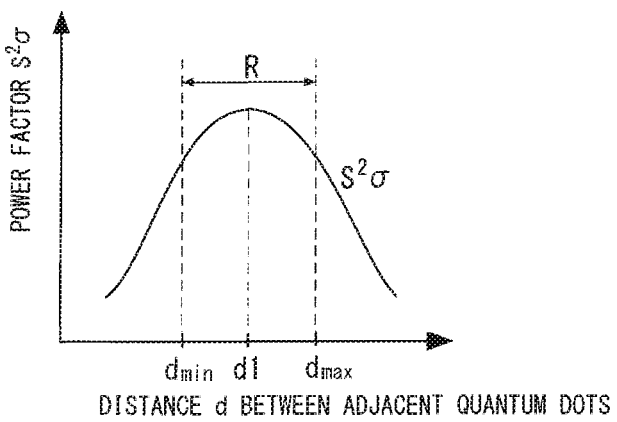
FIG. 1B is a schematic graph indicating a power factor $S^2\sigma$ of a quantum dot portion with respect to a distance d between quantum dots.

With such a ligand 9, the distance d between the adjacent quantum dots 7 falls within the range R in FIG. 1A and FIG. 1B described above. In an example, the distance d is set to d1 in FIG. 1A and FIG. 1B.

The ionic medium 5 is in proximity to (preferably, in contact with) the quantum dot portion 3. In the first embodiment, the ionic medium 5 is solid and is in contact with and bonded to a surface 3c of the quantum dot portion 3.

The ionic medium 5 includes ions 12, and the ions 12 and the carriers 11 in the quantum dot portion 3 are electrically attracted to each other, as illustrated in FIG. 2B. These carriers 11 and ions 12 are present in the vicinity of the interface between the quantum dot portion 3 and the ionic medium 5. The ions 12 have charge polarity opposite to that of the carriers 11 in the quantum dots 7. In the example illustrated in FIG. 2B, the carriers 11 are electrons, and the ions 12 in the ionic medium 5 are positive ions. Such an ionic medium 5 can be produced by a manufacturing method described later.

Figure 3A:
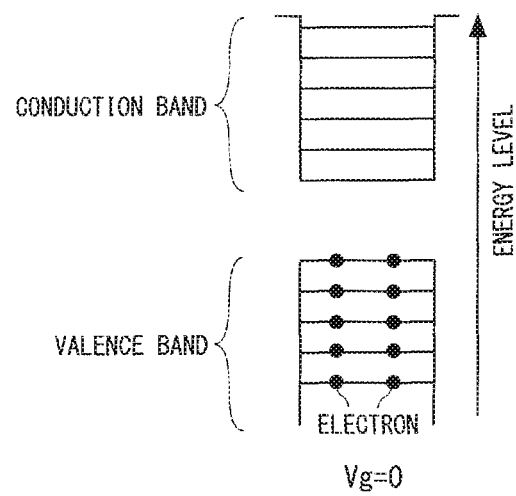
FIG. 3A illustrates discrete energy levels in a quantum dot when there is no ionic medium.
Figure 3B:
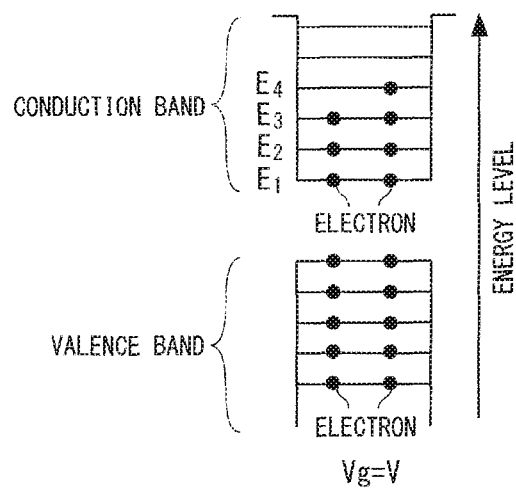
FIG. 3B illustrates discrete energy levels in a quantum dot when there is an ionic medium in proximity to a quantum dot portion.

FIG. 3A and FIG. 3B illustrate discrete electron energy levels in quantum dots. FIG. 3A illustrates the case where there is no ionic medium 5. FIG. 3B illustrates the case where the ionic medium 5 exists in proximity to the quantum dot portion 3 as described above.

In FIG. 3A and FIG. 3B, the conduction band is an energy band that includes vacant energy levels not occupied by electrons. Therefore, when there are electrons in the conduction band, the electrons can transfer to the vacant energy levels, and thereby, can carry an electric current.

In FIG. 3A and FIG. 3B, the valence band is an energy band that includes no vacant energy level. Therefore, in the valence band, electrons cannot transfer to vacant energy levels, and for this reason, cannot carry an electric current.

In the example illustrated in FIG. 3A where there is no ionic medium 5, no electron 11 exists in the conduction band in the quantum dots 7.

In contrast, as illustrated in FIG. 3B, the ionic medium 5 is in proximity to the quantum dot portion 3, and thereby, electrons 11 exist in the conduction band in the quantum dots 7. Specifically, in FIG. 3B, there are a large number of electrons 11 in energy levels $E_1$, $E_2$, $E_3$, and $E_4$ in the conduction band, for the following reasons.

The state where the ions 12 are present in the ionic medium 5 in the vicinity of the interface with the quantum dot portion 3 corresponds to the state where a gate voltage Vg (positive potential) is applied to the surface 3c of the quantum dot portion 3. The gate voltage Vg causes a change in the distribution of electrons 11 in the quantum dots 7 in the vicinity of the surface 3c, from the state illustrated in FIG. 3A to the state illustrated in FIG. 3B. In other words, the number of electrons 11 accommodated in the energy levels in the conduction band increases.

(Thermoelectric Element Material Manufacturing Method)

Figure 4:
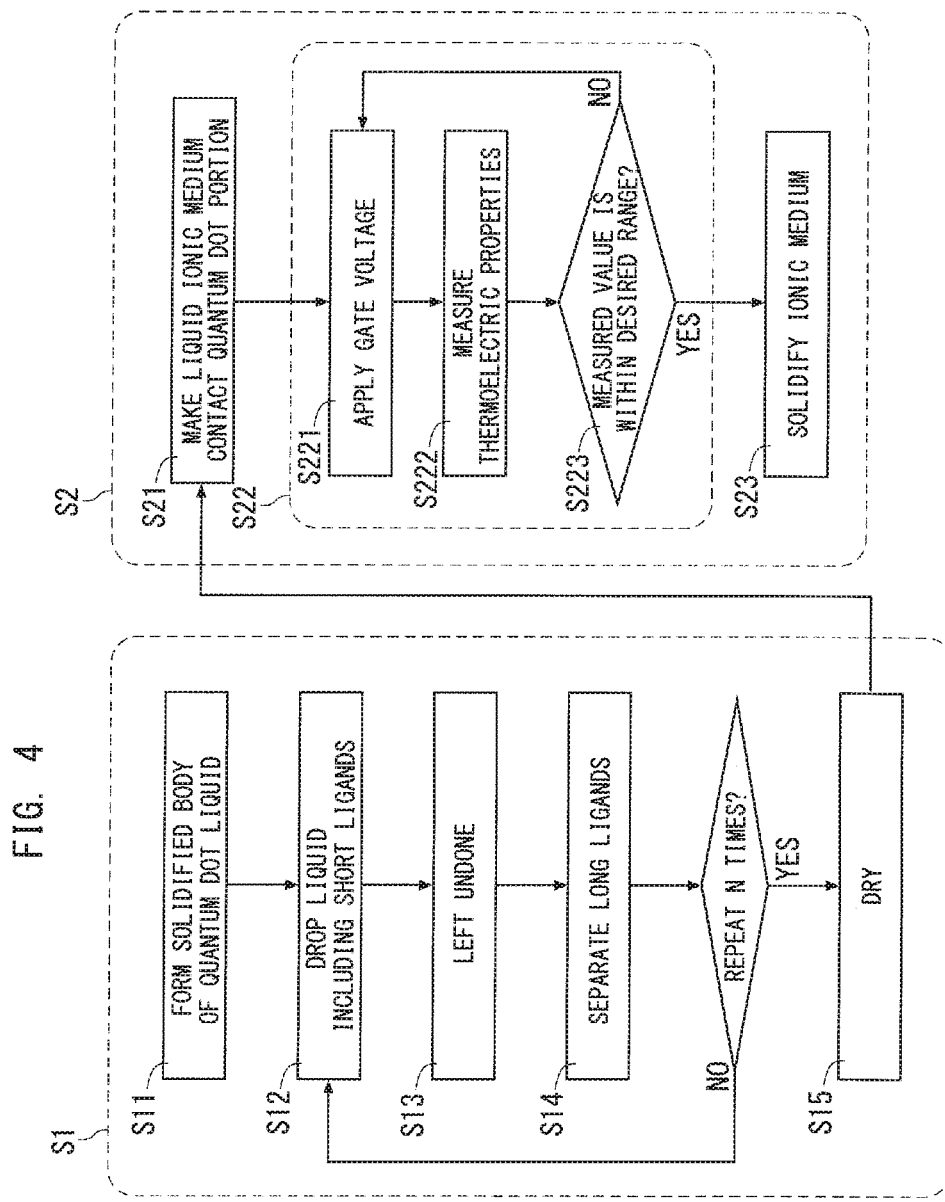
FIG. 4 is a flowchart illustrating a first embodiment of a method for manufacturing a thermoelectric element material.

FIG. 4 is a flowchart illustrating a first embodiment of a method for manufacturing the thermoelectric element material 10. FIG. 5A to FIG. 6B illustrate the method. The method includes a quantum-dot-portion producing process S1 and an ionic-medium producing process S2.

In the quantum-dot-portion producing process S1, the quantum dot portion 3 that includes the quantum dots 7 arranged at an adjusted distance therebetween is produced. Specifically, the quantum dot portion 3 is produced so as to have a configuration in which adjacent quantum dots 7 are separate from each other and are close to each other to an extent allowing the carriers 11 to move between the quantum dots 7.

The quantum-dot-portion producing process S1 includes steps S11 to S15.

Figure 5A:
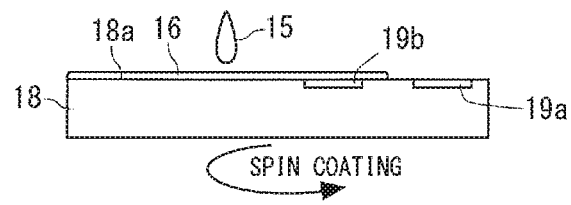
FIG. 5A is a diagram illustrating the thermoelectric element material manufacturing method.

At the step S11, a quantum dot solid 16 is formed by solidification of a quantum dot solution 15 that is a liquid including a large number of quantum dots 7 (FIG. 5A).

Figure 7A:
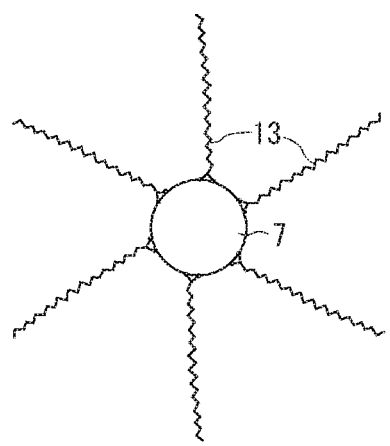
FIG. 7A is a schematic view of a quantum dot including first ligands bonded thereto.
Figure 7B:
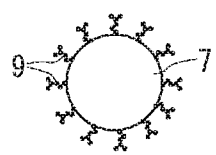
FIG. 7B is a schematic view of a quantum dot including second ligands bonded thereto.

FIG. 7A is a schematic view of the one quantum dot 7. In the quantum dot solution 15, each quantum dot 7 includes first ligands 13 bonded thereto as illustrated in FIG. 7A. The first ligands 13 in FIG. 7A are longer in length than the above-described ligands 9 in FIG. 2C. Note that the quantum dot solution 15 including such long first ligands 13 is used in order to prevent quantum dots 7 from approaching each other and fusing together over time.

In an implementation example, spherical PbS (lead(II) sulfide) is used as the quantum dot 7. A colloidal solution including PbS and chloroform is prepared as a quantum dot solution 15. In an example, PbS as the quantum dot 7 has a diameter of 3.7 nm or 4.7 nm, and the PbS concentration in the colloidal solution is 5 mg/mL. The first ligands 13 bonded to PbS are oleic acid.

In the implementation example, the step S11 is carried out by spin coating, as follows. A substrate 18 is disposed and can be spun (rotated). The central axis of the rotation is preferably perpendicular to an upper surface 18a of the substrate 18. The substrate 18 is rotated about the central axis at a speed of 4000 rpm, for example. In this state, the quantum dot solution 15 of 10 to 20 microliters, for example, is dropped onto the upper surface 18a. Thereafter, the rotation is continued for 60 seconds to cause the solvent to be scattered from the quantum dot solution 15 on the upper surface 18a, and to cause the quantum dot solution 15 on the substrate 18 (the assembly) to be dried. As a result, the quantum dot solid 16 in the form of a film of the dried quantum dot solution 15 is formed on the upper surface 18a. Note that on the upper surface 18a of the substrate 18, a gate electrode 19a and an electrode 19b are formed in advance, for use at the step S22 as described later.

Figure 5B:
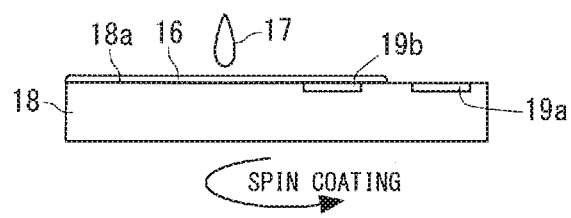
FIG. 5B is another diagram illustrating the thermoelectric element material manufacturing method.

At the step S12, a ligand liquid 17 that is a liquid including second ligands 9 shorter in length than the first ligands 13 is dropped onto the quantum dot solid 16 (FIG. 5B). In the implementation example, the second ligands 9 are iodine or 1,2-ethanedithiol. In this case, the ligand liquid 17 may be methanol including iodine dissolved therein or acetonitrile including 1,2-ethanedithiol dissolved therein, for example. The ligand liquid 17 of 200 microliters, for example, is dropped onto the quantum dot solid 16.

At the step S13, the quantum dot solid 16 with the ligand liquid 17 dropped thereon is left for a predetermined time (e.g., about ten minutes). As a result, the ligands bonded to the quantum dots 7 change from the first ligands 13 to the second ligands 9, and the adjacent quantum dots 7 approach each other and are coupled via the second ligands 9.

At the step S14, the remaining first ligands 13 are removed from the quantum dot solid 16.

In the implementation example, at the step S14, the substrate 18 is rotated so as to cause the solvent (e.g., the solvent of the ligand liquid 17) including the first ligands 13 dissolved therein to be scattered from the quantum dot solid 16. For example, the substrate 18 is rotated at 4000 rpm for 60 seconds, as in the step S11 above. With this, the first ligands 13 together with the solvent are scattered and removed from the quantum dot solid 16. In the implementation example, the first ligands 13 are oleic acid, and the solvent dissolving the same is methanol.

For example, when the solvent for dissolving the first ligands 13 is insufficient for conducting the step S14, the solvent that dissolves the first ligands 13 is dropped onto the quantum dot solid 16 after the step S13 and before the step S14.

The above-described steps S11 to S14 acquire the quantum dot solid 16 (hereinafter, referred to as "quantum-dot-portion preparation layer") with the first ligands 13 removed therefrom.

Figure 5C:
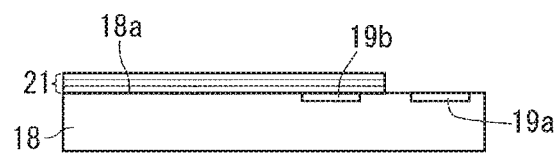
FIG. 5C is still another diagram illustrating the thermoelectric element material manufacturing method.

In the implementation example, the steps S11 to S14 are repeated. In this case, at the re-performed step S11, the quantum dot solution 15 is dropped onto the quantum-dot-portion preparation layer formed at the immediately preceding step S14, and the other points are the same as those described above. The repetition of the steps S11 to S14 acquires a layered body 21 of the quantum-dot-portion preparation layers as illustrated in FIG. 5C.

After the quantum-dot-portion preparation layer or the layered body 21 is acquired by the steps S11 to S14 or by the repetition thereof as described above, the process proceeds to the step S15.

At the step S15, the quantum-dot-portion preparation layer or the layered body 21 is dried. For example, the quantum-dot-portion preparation layer or the layered body 21 is placed in an environment where temperature is about 105° C. in order to remove the solvent remaining in the quantum-dot-portion preparation layer or the layered body 21. In the implementation example, at the step S15, the substrate 18 on which the layered body 21 is formed is placed on a hot plate of about 105° C. and left for about 20 minutes. As a result, the dried layered body 21 is acquired as the quantum dot portion 3.

In the implementation example, the quantum-dot-portion producing process S1 is carried out in a sealed container (glove box) filled with nitrogen gas.

In the ionic-medium producing process S2, the ionic medium 5 is produced. The ionic-medium producing process S2 includes the steps S21 to S23.

Figure 5D:
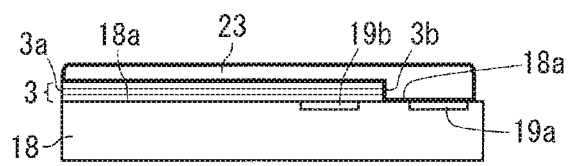
FIG. 5D is yet another diagram illustrating the thermoelectric element material manufacturing method.

At the step S21, the quantum dot portion 3 acquired in the quantum-dot-portion producing process S1 is put in a contact state where the surface 3c of the quantum dot portion 3 contacts with a liquid ionic medium 23. For example, the liquid ionic medium 23 is dropped onto the surface 3c to form a film of the liquid ionic medium 23 on the surface 3c as illustrated in FIG. 5D. In the example of FIG. 5D, the liquid ionic medium 23 is also in contact with the gate electrode 19a.

The liquid ionic medium 23 may be any liquid including ions therein. For example, the liquid ionic medium 23 may be a liquid (e.g., molten) salt (i.e., an ionic liquid) including ions, or may be an ionic gel or an electrolyte solution.

The step S21 and step S22 (described later) are carried out in an environment where temperature is not lower than a melting point of the liquid ionic medium 23. The melting point of the liquid ionic medium 23 may be higher than room temperature (25° C.) and be not higher than the melting or fusing temperature of the quantum dot portion. For example, the melting point may be higher than 25° C. and not higher than 120° C.

Examples of the ionic liquid 23 that is in a solid state at an atmospheric pressure of 1 atm and at temperature of 25° C. include the following (1) to (5).
(1) [N-Trimethyl-N-hexylammonium] [bis(trifluoromethanesulfonyl)imide]
(2) [1-ethyl-3-methylimidazolium] [chloride]
(3) [Tetrabutylammonium] [Trifluoromethanesulfonate]
(4) [1-Butylpyridinium] [Hexafluorophosphate]
(5) [1-Ethyl-3-methylimidazolium] [Hexafluorophosphate]

The melting point is 27° C. in (1), 84° C. in (2), 113° C. in (3), 75° C. in (4), and 61° C. in (5).

Examples of the ionic liquid 23 that is in the liquid state at an atmospheric pressure of 1 atm and at temperature of 25° C. include the following (6) to (10).
(6) [DEME] [TFSI], i.e., [N,N-Diethyl-N-Methyl-N-(2-methoxyethyl)Ammonium] [bis(Trifluoromethanesulfonyl)Imide]
(7) [MPPyrr] [TFSI], i.e., [1-Methyl-1-propylpyrrolidinium] [bis(trifluoromethanesulfonyl)imide]
(8) [BMIM] [TFSI], i.e., [1-Butyl-3-methylimidazolium] [bis(trifluoromethylsulfonyl)imide]
(9) [HMIM] [TFSI], i.e., [1-hexyl-3-methylimidazolium] [bis(trifluoromethylsulfonyl)imide]
(10) [DMMA] [BF4], i.e., [N,N-Diethyl-N-methyl-(2-methoxyethyl)ammonium] [tetrafluoroborate]

Examples of the ionic gel 23 include the following (11) to (13).
(11) PS-PMMA-PS block copolymer with [EMIM] [TFSI] added thereto
Here, PS-PMMA-PS stands for polystyrene-poly(methylmethacrylate)-polystyrene.
(12) PVDF-HFP block copolymer with [HMIM] [TFSI] added thereto
Here, PVDF-HFP stands for poly(vinylidene fluoride-co-hexafluoropropylene).
(13) Microcellulose fibers (e.g., Arbocel (registered trademark) MF40-7) with a mixed ionic liquid of [EMIM] [TFSI] and [Me(EG)$_1$] [(Me)PO$_3$] added thereto
Here, [Me (EG$_1$] [(Me) PO$_3$] stands for 2-(2-methoxyethoxy)ethyl methylphosphonate.

Other Examples of the ionic medium 23 (polyelectrolyte solution or polymeric ionic liquid) include the following (14) to (16).
(14) PEO (Polyethylene Oxide) with LiClO$_4$ added thereto
(15) P(VPA-AA), i.e., poly(vinylphosphonic acid-acrylic acid)
(16) PS-PIL-PS triblock copolymer
Here, PS stands for polystyrene, and PIL stands for 1-[(2-acryloyloxy)ethyl]-3-butylimidazolium bis(trifluoromethylsulfonyl)imide.

In the implementation example, the liquid ionic medium 23 is [DEME] [TFSI].

Figure 6A:
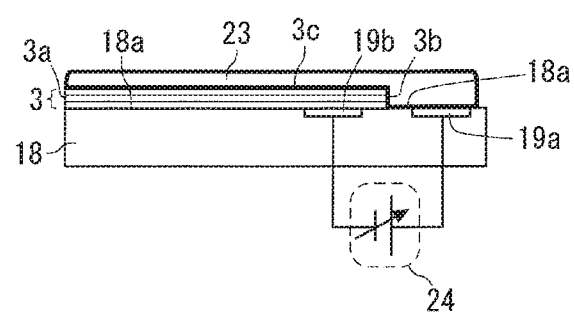
FIG. 6A is yet another diagram illustrating the thermoelectric element material manufacturing method.

At the step S22, in the above-described contact state, a gate voltage Vg is applied across a voltage application position (in FIG. 6A, the gate electrode 19a) in the liquid ionic medium 23 and the quantum dot portion 3 (in FIG. 6A, the electrode 19b). The voltage is applied by a power source 24. As a result, the carriers 11 attracted to the ions 12 in the liquid ionic medium 23 occur in the vicinity of the interface (the surface 3c) between the quantum dot portion 3 and the liquid ionic medium 23. Note that the voltage application position may be any position that is separate from the interface between the liquid ionic medium 23 and the quantum dot portion 3.

Figure 6B:
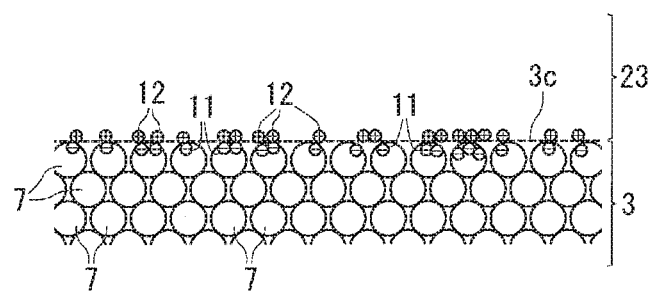
FIG. 6B is yet another diagram illustrating the thermoelectric element material manufacturing method.

FIG. 6B is a partially enlarged view of FIG. 6A, illustrating the vicinity of the surface 3c of the quantum dot portion 3. As illustrated in FIG. 6B, the step S22 produces the state where the electrons 11 and the ions 12 are electrically attracted to each other in the vicinity of the surface 3c.

In the implementation example, the step S22 includes the steps S221 to S223.

At the step S221, a gate voltage Vg is applied across the gate electrode 19a and the electrode 19b, as described above. The application of the gate voltage Vg generates an electric-double layer at the interface between the quantum dot portion 3 and the liquid ionic medium 23. This electric double layer is solid-like (quasi-solid).

In this state, at the step S222, a Seebeck coefficient S and an electrical conductivity σ of the quantum dot portion 3 are measured. The specific procedure at the step S222 is described later.

At the step S223, it is determined whether the Seebeck coefficient S and the electrical conductivity σ measured at the step S222, or a power factor $S^2\sigma$ acquired from those values falls within a desired range.

When the determination result at the step S223 is affirmative, the process proceeds to step S23; otherwise, the gate voltage Vg is changed to another value, and then, the steps S221 and S222 are performed again.

At the step S23, in the state where the gate voltage Vg is applied across the gate electrode 19a and the electrode 19b in the above-described contact state, the liquid ionic medium 23 (behaving as quasi-solid in the form of an electric-double-layer capacitor at the above-described interface) is caused to solidify to become the solid ionic medium 5. This solidification is made by cooling and freezing the liquid ionic medium 23 at a temperature lower than the melting point (freezing temperature) thereof. This gate voltage Vg at the step S23 is the value at which the determination result at the step S223 is affirmative.

Note that the above-described steps S222 and S223 may be omitted. In this case, the liquid ionic medium 23 is caused to solidify at the step S23 in the state where a predetermined gate voltage Vg is applied across the gate electrode 19a and the electrode 19b. The predetermined gate voltage Vg is a value that makes the determination result at the step S223 affirmative.

The step S23 acquires the thermoelectric element material 10 including the solid ionic medium 5 in contact with and bonded to the surface 3c of the quantum dot portion 3. Further, by the step S23, the number of carriers 11 present in the quantum dot portion 3 is fixed.

After the liquid ionic medium 23 solidifies and becomes the solid ionic medium 5 at the step S23, the application of the gate voltage Vg is stopped. Thereafter, the ions 12 in the solid ionic medium 5 and the carriers 11 in the quantum dots 7 are kept in the state of being electrically attracted to each other in the vicinity of the surface 3c of the quantum dot portion 3. This is because the liquid ionic medium 23 has solidified to become the solid ionic medium 5.

The thus-manufactured thermoelectric element material 10 according to the first embodiment is used as a thermoelectric element with the liquid ionic medium 23 being in the solid state. In other words, the thermoelectric element material 10 is used in an environment where the temperature is lower than the melting point of the liquid ionic medium 23.

(Measurement of Thermoelectric Properties)

Figure 8A:
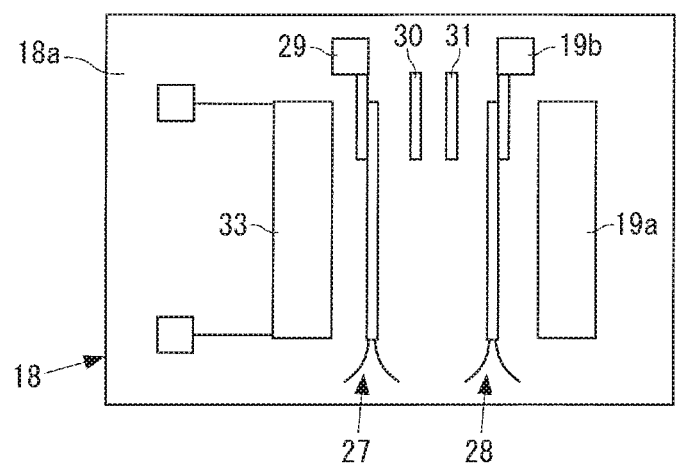
FIG. 8A illustrates an exemplary configuration for measuring a Seebeck coefficient S and an electrical conductivity σ of a quantum dot portion.
Figure 8B:
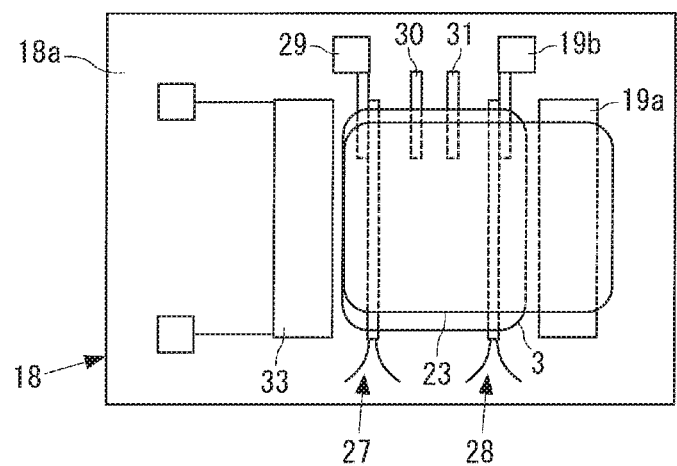
FIG. 8B is another diagram illustrating the exemplary configuration for measuring a Seebeck coefficient S and an electrical conductivity σ of a quantum dot portion.

One example of a method of measuring the thermoelectric properties at the above-described step S222 is described with reference to FIG. 8A and FIG. 8B. FIG. 8A and FIG. 8B are top views of the substrate 18.

First, prior to the quantum-dot-portion producing process S1, not only the gate electrode 19a and the electrode 19b, but also as resistance thermometers 27 and 28, probes 29 to 31, and a heater 33 are formed on an upper surface 18a of the substrate 18, as illustrated in FIG. 8A.

Next, the quantum dot portion 3 is formed on the upper surface 18a of the substrate 18, in accordance with the above-described quantum-dot-portion producing process S1 (FIG. 8B). The quantum dot portion 3 includes a lower surface in contact with the electrode 19b, the resistance thermometers 27 and 28, and the probes 29 to 31.

Thereafter, the ionic-medium producing process S2 is carried out. The step S222 in the ionic-medium producing process S2 is performed in the following manner, in the state where temperature difference is caused in the quantum dot portion 3 by the heater 33. The resistance thermometer 27 is used to measure temperature T1 at the probe 29, and the resistance thermometer 28 is used to measure temperature T2 at the electrode 19b. A potential difference ΔV1 between the probe 29 and the electrode 19b is measured. Subsequently, the probe 29 and the electrode 19b are used to cause an electric current I to flow between the probe 29 and the electrode 19b in the quantum dot portion 3, and the probes 30 and 31 are used to measure a potential difference ΔV2 between the probes 30 and 31.

The measured temperatures T1, T2 and potential difference ΔV1 are used to acquire a Seebeck coefficient S=−ΔV1/(T1−T2).

The electric current I made to flow, the measured potential difference ΔV2, a distance between the probes 30 and 31, and the cross-sectional area of the quantum dot portion 3 are used to acquire an electrical conductivity σ of the quantum dot portion 3.

Furthermore, a power factor $S^2\sigma$ is acquired from the acquired values of S and σ.

Figure 9A:
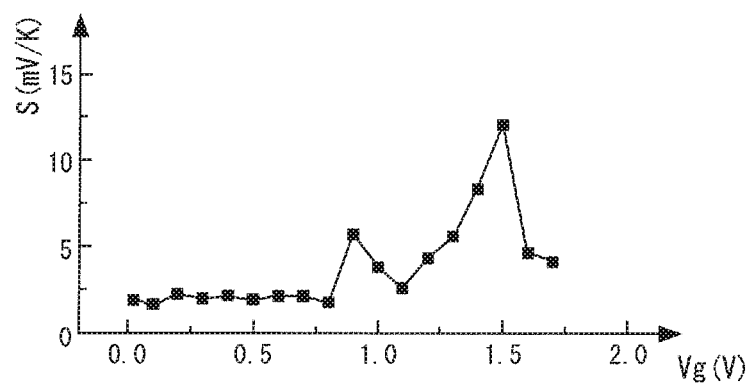
FIG. 9A indicates a relationship between a gate voltage Vg and a Seebeck coefficient S in a thermoelectric element material according to the first embodiment.
Figure 9B:
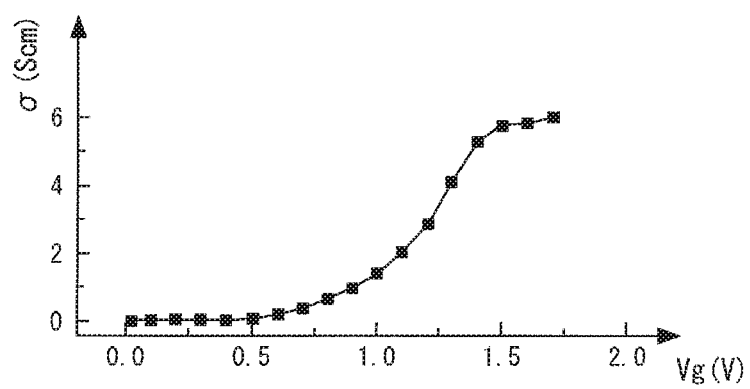
FIG. 9B indicates a reference example of a relationship between a gate voltage Vg and an electrical conductivity σ in the thermoelectric element material according to the first embodiment.
Figure 9C:
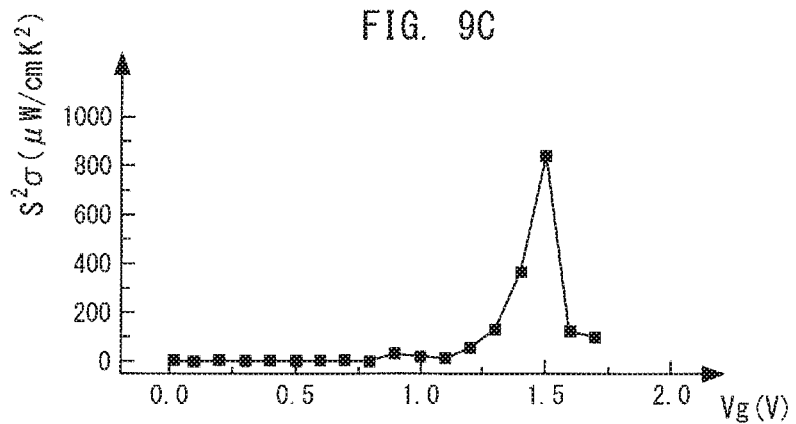
FIG. 9C indicates a reference example of a relationship between a gate voltage Vg and a power factor $S^2\sigma$ in the thermoelectric element material according to the first embodiment.

FIG. 9A to FIG. 9C illustrate the measurement results of S, σ and $S^2\sigma$ of the thermoelectric element material 10 according to the above-described first embodiment. FIG. 9A to FIG. 9C indicate values actually acquired by the method illustrated in FIG. 8A and FIG. 8B. FIG. 9A indicates a relationship between the gate voltage Vg and the Seebeck coefficient S. FIG. 9B indicates a relationship between the gate voltage Vg and the electrical conductivity σ. FIG. 9C indicates a relationship between the gate voltage Vg and the power factor $S^2\sigma$.

As apparent from FIG. 9A, in the thermoelectric element material 10 of the first embodiment, the acquired Seebeck coefficient S (of about 12.5 mV/K=12500 μV/K) is much greater than a value (e.g., Seebeck coefficient S=400 μV/K in NPL 1 above) in the conventional case.

Furthermore, as apparent from FIG. 9C, in the thermoelectric element material 10 of the first embodiment, the acquired power factor $S^2\sigma$ (of about 800 μW/cm·K$^2$) is much higher than a value (e.g., 17 μW/cm·K$^2$ in NPL 1) in the conventional case.

The data of FIG. 9A to FIG. 9C was acquired for the thermoelectric element material 10 in which the ionic medium 5 was formed by using [DEME] [TFSI] as the ionic liquid 23, and the quantum dot portion 3 of PbS as the quantum dots 7 was formed of five layers of the quantum dot solids 16 (i.e., the quantum-dot-portion preparation layers). The data of FIG. 9B to FIG. 9C are based on the assumption that the entire five layers of the quantum dot solids 16 contribute to the electrical conductivity σ.

Figure 9D:
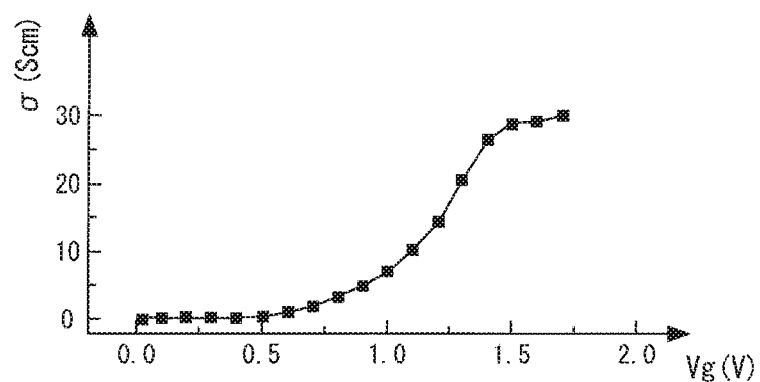
FIG. 9D indicates an actual relationship between a gate voltage Vg and an electrical conductivity σ in the thermoelectric element material according to the first embodiment.
Figure 9E:
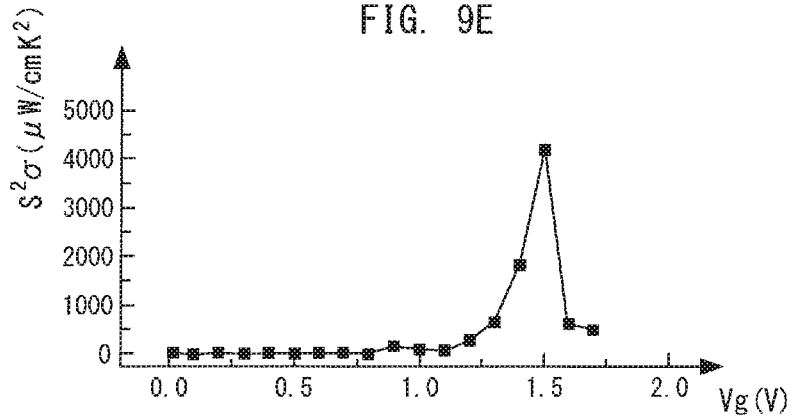
FIG. 9E indicates an actual relationship between a gate voltage Vg and a power factor $S^2\sigma$ in the thermoelectric element material according to the first embodiment.

However, the present inventors found that among the five layers, only one layer of the quantum dot solid 16 contacting with the ionic medium 5 contributes to the electrical conductivity σ. For this reason, the actual electrical conductivity σ is five times the data in FIG. 9B, and is indicated in FIG. 9D. In other words, FIG. 9D indicates an actual relationship between the gate voltage Vg and the electrical conductivity σ. FIG. 9E is based on FIG. 9A and FIG. 9D, and indicates an actual relationship between the gate voltage Vg and the power factor $S^2\sigma$.

In addition, the present inventors measured the thermal conductivity κ of the same thermoelectric element material 10, and the measured value κ was 0.69 W/m·K. Then, the maximum value of the dimension-less figure-of-merit ZT ($=S^2\sigma T/\kappa$) is calculated as 200, in which T is room temperature of 300K, and $S^2\sigma$ is based on FIG. 9E, and κ is 0.69 W/m·K. This ZT value 200 is much higher than the highest ZT value 3 to 4 achieved by the prior art. Thus, The ZT value 200 achieved by the first embodiment is the new world record.

Second Embodiment

A thermoelectric element material 10 according to a second embodiment of the present invention is described.

The second embodiment is identical to the first embodiment except for the points described below.

The thermoelectric element material 10 according to the second embodiment includes a quantum dot portion 3 and no ionic medium 5. In this case, impurities are added to quantum dots 7 to increase a carrier density in the quantum dot portion 3.

In the second embodiment, in the above-described method for manufacturing the thermoelectric element material 10, the ionic-medium producing process S2 is omitted, and instead, the quantum dots 7 including impurities added thereto in advance are used at the step S1 (S11). For example, each quantum dot 7 including the impurity (dopant) added thereto may be PbS as the quantum dot 7 with Ag as the impurity (dopant) added thereto. However, the impurities may be added to the quantum dots 7 in any manner as long as the impurities ensure that the quantum dot portion 3 in the manufactured thermoelectric element material 10 includes therein the carriers that can move between adjacent quantum dots 7.

Except for the above-described points, the quantum-dot-portion producing process S1 in the second embodiment may be identical to that in the first embodiment.

The present invention is not limited to the above-described embodiments. Various modifications are of course possible within the scope of the technical idea of the present invention. For example, any one of the following modifications 1 to 5 may be adopted alone, or two or more of the modifications 1 to 5 combined as appropriate may be adopted. In such a case, the above description applies except for the points stated below. The modifications 1, 2, 4, and 5 are applicable to the first and second embodiments, and the modification 3 is applicable to the first embodiment.

(Modification 1)

The quantum dot 7 is not limited to PbS. For example, the quantum dot 7 may be a metal chalcogenide (e.g., PbTe, PbSe, SnTe, SnSe, SnS, CdS, CdTe, ZnTe, ZnSe, FeSe, FeTe, $FeS_2$, AgTe, AgSe, AgS, HgTe, GeTe, $Bi_2S_3$, $Bi_2Te_3$, $Bi_2Se_3$, or the like), an oxide (e.g., $SnO_2$, $In_2O_3$, $TiO_2$ with an impurity added thereto, or the like), another binary compound (e.g., InAs, $Bi_{1-x}Sb_x$, or the like), a ternary or quaternary compound (e.g., $CuInSe_2$, $CuZnS_4$, or the like), a perovskite (e.g., $CsPbX_3$ (where X is Cl, Br, or I)), a single compound (e.g., Si, C, Ge, or the like), a metallic nanocrystal (e.g., Au, Ag, Ga, Sb, or the like), a core-shell quantum dot of these, or a combination of these.

The quantum dot 7 may have a shape other than the spherical shape. For example, the quantum dot 7 may have a shape of a cube, a flat plate, a rod, a star, or the like.

(Modification 2)

The above-described second ligand 9 is not limited to iodine and 1,2-ethanedithiol, but may be any type of organic or inorganic ligand as long as the second ligand 9 is short enough to cause the adjacent quantum dots 7 to be close to each other as described above, or as long as the second ligand 9 allows the carriers to move efficiently between the adjacent quantum dots 7 even when the second ligand 9 is longer than the second ligand 9 in the above-described embodiment (or the above-described example or implementation example). In these cases, the method for manufacturing the thermoelectric element material may be the same as that described above except for the type of organic or inorganic ligand. The second ligand 9 may be a single-atom ligand. Note that the above-mentioned second ligand 9 longer than the second ligand 9 in the above-described embodiment may be thiophene-2,5-dicarboxylic acid, or [2,2':5,2"-terthiophene]-5,5"-dithiol, or [2,2':5,2"-terthiophene]-5,5"-dicarboxylic acid, or triphenylene ethynylene, for example, but is not limited to these.

(Modification 3)

The ionic medium of the thermoelectric element material 10 may be a liquid ionic medium 23 that has not solidified. In this case, the thermoelectric element material 10 is used as a thermoelectric element in the state where the ionic medium 23 is in the liquid state and the gate voltage Vg is applied across the above-described voltage application position and the quantum dot portion 3. In this case, the above-described step S23 is omitted.

(Modification 4)

The above steps S11 and S12 are not limited to the above-described contents, but may be carried out by dip coating, for example, as follows.

At the step S11, the substrate 18 is immersed in a quantum dot solution 15 contained in a vessel, and then taken out of the vessel. Thereby, a film of the quantum dot solution 15 is formed on the upper surface 18a of the substrate 18. The film is then dried and solidified, whereby a film of the quantum dot solid 16 is acquired.

Next, at the step S12, the substrate 18 is immersed in a ligand liquid 17 contained in a vessel, and then taken out of the vessel, to achieve the state where the ligand liquid 17 is supplied to the quantum dot solid 16.

(Modification 5)

The above-described step S1 may be carried out as follows.

First, the quantum dot solution 15 and a ligand liquid 17 are poured into a vessel to generate a mixed liquid thereof (hereinafter, simply referred to as the "mixed liquid").

The mixed liquid is left for a predetermined time (e.g., about ten minutes). As a result, as in the above case, the ligands bonded to the quantum dots 7 change from the first ligands 13 to the second ligands 9, and the adjacent quantum dots 7 approach each other and are coupled via the second ligands 9.

Thereafter, the first ligands 13 are caused to precipitate in the mixed liquid. At this time, a material causing the first ligands 13 to precipitate is added to the mixed liquid as necessary.

Next, a supernatant of the mixed liquid is extracted, or the mixed liquid is subjected to centrifugation to acquire a liquid that is the mixed liquid with the first ligands 13 removed therefrom.

The liquid is dried to acquire a quantum dot portion 3. This drying process may be performed as in the above-described step S15. For example, a film of the liquid is formed on the substrate, and temperature of the substrate is set to about 105° C. and left until the film becomes the solid quantum dot portion 3.

REFERENCE SIGNS LIST

3: quantum dot portion; 3a: one end; 3b: other end; 3c: surface; 5: ionic medium (solid ionic medium); 7: quantum dot; 9: ligand (second ligand); 10: thermoelectric element material; 11: carrier (electron); 12: ion (positive ion); 13: first ligand; 15: quantum dot solution; 16: quantum dot solid; 17: ligand liquid; 18: substrate; 18a: upper surface; 19a: gate electrode; 19b: electrode; 21: layered body; 23: ionic medium (liquid ionic medium); 24: power source; 27, 28: resistance thermometer; 29, 30, 31: probe; and 33: heater.

The invention claimed is:

1. A thermoelectric element material for use in a thermoelectric element, comprising: a quantum dot portion that includes a large number of quantum dots, wherein the quantum dot portion includes carriers therein, the carriers serving to carry an electric current,
of the large number of quantum dots, adjacent quantum dots are separate from each other and are close to each other to an extent allowing the carriers to move between the quantum dots,
the thermoelectric element material comprises an ionic medium including ions, the ions and the carriers in the quantum dot portion are electrically attracted to each other, and the ionic medium is in proximity to the quantum dot portion, and
the quantum dot portion includes:
    a surface facing the ionic medium and
    first and second ends opposite to each other in a direction along the surface
whereby a temperature difference between the first and second ends causes a potential difference to occur between the first and second ends, and the potential difference is output externally.

2. The thermoelectric element material according to claim 1, wherein in the quantum dot portion, the adjacent quantum dots are coupled via a ligand, and
the ligand has a length that is short enough to the extent allowing the carriers to move between the adjacent quantum dots.

3. The thermoelectric element material according to claim 1, wherein the ionic medium is in contact with the quantum dot portion.

4. A method for manufacturing a thermoelectric element material that includes a quantum dot portion including a large number of quantum dots wherein carriers serving to carry an electric current are present in the quantum dot portion,
the method comprising: a quantum-dot-portion producing process of causing adjacent quantum dots among the large number of quantum dots to be separate from each other and close to each other to an extent allowing the carriers to move between the quantum dots,
wherein the method comprises:
bringing a liquid ionic medium into contact with a surface of the quantum dot portion, after the quantum dot portion is acquired in the quantum-dot-portion producing process;
in this state, applying a voltage across a voltage application position in the liquid ionic medium and the quantum dot portion, and
in this state, causing the liquid ionic medium to solidify, such that the quantum dot portion includes:
    a surface facing the solidified ionic medium and
    first and second ends opposite to each other in a direction along the surface,
whereby a temperature difference between the first and second ends causes a potential difference to occur between the first and second ends, and the potential difference is output externally.

5. The method for manufacturing the thermoelectric element material according to claim 4, wherein the quantum-dot-portion producing process comprises:
    (A) solidifying a quantum dot liquid as a liquid including the large number of quantum dots with first ligands bonded thereto, and thereby forming a quantum dot solid;
    (B) dropping, onto the quantum dot solid, a ligand liquid as a liquid including second ligands shorter in length than the first ligands, and thereby changing ligands bonded to the quantum dots from the first ligands to the second ligands in the quantum dot solid; and
    (C) removing the first ligands from the quantum dot solid, and thereby acquiring the quantum dot portion.

6. The method for manufacturing the thermoelectric element material according to claim 5,
wherein at (A), the quantum dot solid is formed on an upper surface of a rotatably disposed substrate,
the ligand liquid includes a solvent for dissolving the first ligands, or a solvent for dissolving the first ligands is dropped onto the quantum dot solid before (C) is performed, and
at (C), the substrate is rotated to cause the solvent with the first ligands dissolved therein to be scattered from the quantum dot solid.

7. A thermoelectric element material for use in a thermoelectric element, comprising: a quantum dot portion that includes a large number of quantum dots,
wherein the quantum dot portion includes carriers therein, the carriers serving to carry an electric current,
of the large number of quantum dots, adjacent quantum dots are separate from each other,
in the quantum dot portion, the adjacent quantum dots are coupled via a ligand so as to allow the carriers to move between the adjacent quantum dots,
the thermoelectric element material comprises an ionic medium including ions, the ions and the carriers in the quantum dot portion are electrically attracted to each other, and the ionic medium is in proximity to the quantum dot portion, and
the quantum dot portion includes:
    a surface facing the ionic medium, and
    first and second ends opposite to each other in a direction along the surface,
whereby a temperature difference between the first and second ends causes a potential difference to occur between the first and second ends, and the potential difference is output externally.

* * * * *